United States Patent
Shen et al.

(10) Patent No.: US 12,543,521 B2
(45) Date of Patent: Feb. 3, 2026

(54) METHODS OF FORMING MEMORY DEVICE WITH REDUCED RESISTIVITY

(71) Applicant: Applied Materials, Inc., Santa Clara, CA (US)

(72) Inventors: Qixin Shen, Sunnyvale, CA (US); Chuanxi Yang, Los Altos, CA (US); Hang Yu, San Jose, CA (US); Deenesh Padhi, Sunnyvale, CA (US); Gill Yong Lee, San Jose, CA (US); Sung-Kwan Kang, San Jose, CA (US); Abdul Wahab Mohammed, Santa Clara, CA (US); Hailing Liu, Union City, CA (US)

(73) Assignee: Applied Materials, Inc., Santa Clara, CA (US)

(*) Notice: Subject to any disclaimer, the term of this patent is extended or adjusted under 35 U.S.C. 154(b) by 910 days.

(21) Appl. No.: 17/361,925

(22) Filed: Jun. 29, 2021

(65) Prior Publication Data

US 2022/0415651 A1    Dec. 29, 2022

(51) Int. Cl.
*H01L 21/02* (2006.01)
*H01L 21/033* (2006.01)
*H10B 12/00* (2023.01)

(52) U.S. Cl.
CPC .... *H01L 21/02304* (2013.01); *H01L 21/0217* (2013.01); *H01L 21/02211* (2013.01);
(Continued)

(58) Field of Classification Search
CPC ........... H01L 21/02304; H01L 21/0217; H01L 21/02211; H01L 21/02274;
(Continued)

(56) References Cited

U.S. PATENT DOCUMENTS

| | | | |
|---|---|---|---|
| 6,358,810 B1 * | 3/2002 | Dornfest | H10D 1/682 |
| | | | 438/653 |
| 6,627,497 B2 * | 9/2003 | Nakanishi | H01L 21/02337 |
| | | | 257/E21.01 |

(Continued)

FOREIGN PATENT DOCUMENTS

| KR | 100646921 B1 * | 11/2006 | ....... H01L 21/28556 |
|---|---|---|---|
| KR | 101725152 B1 | 4/2017 | |

OTHER PUBLICATIONS ( Research article/ Oct. 2004 ă Thermally grown ruthenium oxide thin film J.Vac.Sci. Technol. B22, 2319-2325 (Year: 2004).*

(Continued)

*Primary Examiner* — Duy T Nguyen
*Assistant Examiner* — Pratiksha Jayant Lohakare
(74) *Attorney, Agent, or Firm* — SERVILLA WHITNEY LLC

(57) ABSTRACT

Memory devices and methods of forming memory devices are described. The memory devices comprise a silicon nitride hard mask layer on a ruthenium layer. Forming the silicon nitride hard mask layer on the ruthenium comprises pre-treating the ruthenium layer with a plasma to form an interface layer on the ruthenium layer; and forming a silicon nitride layer on the interface layer by plasma-enhanced chemical vapor deposition (PECVD). Pre-treating the ruthenium layer, in some embodiments, results in the interface layer having a reduced roughness and the memory device having a reduced resistivity compared to a memory device that does not include the interface layer.

15 Claims, 2 Drawing Sheets

(52) U.S. Cl.
CPC .. *H01L 21/02274* (2013.01); *H01L 21/02315* (2013.01); *H01L 21/0332* (2013.01); *H01L 21/0335* (2013.01); *H01L 21/0337* (2013.01); *H10B 12/30* (2023.02)

(58) Field of Classification Search
CPC ........... H01L 21/02315; H01L 21/0332; H01L 21/0335; H01L 21/0337; H01L 21/32138; H01L 21/32139; H01L 21/3215; H10B 12/30; H10B 12/488
USPC ....................................................... 257/296
See application file for complete search history.

(56) References Cited

U.S. PATENT DOCUMENTS

| | | | |
|---|---|---|---|
| 10,515,796 B2 | 12/2019 | Tsiang et al. | |
| 2001/0039115 A1* | 11/2001 | Tsuneda ............ | H01L 21/28568 438/650 |
| 2001/0043453 A1* | 11/2001 | Narwankar ............. | H01L 28/75 361/306.3 |
| 2001/0054728 A1* | 12/2001 | Paz de Araujo .... | C23C 18/1245 257/296 |
| 2002/0048878 A1* | 4/2002 | Song ........................ | H01L 28/55 438/243 |
| 2002/0055223 A1* | 5/2002 | Kutsunai ................ | H10D 1/682 257/295 |
| 2003/0224571 A1* | 12/2003 | Iijima .................... | H10D 1/696 257/E21.018 |
| 2004/0051129 A1* | 3/2004 | Paz de Araujo .. | H01L 21/31691 257/E21.021 |
| 2006/0273366 A1* | 12/2006 | Ko .......................... | H01L 28/65 257/295 |
| 2007/0146971 A1* | 6/2007 | Dweik .................. | H01G 9/042 361/532 |
| 2009/0029539 A1 | 1/2009 | Sung et al. | |
| 2011/0076390 A1* | 3/2011 | Cerio, Jr. .......... | H01L 21/28556 427/96.8 |
| 2012/0075767 A1* | 3/2012 | Popovici ........... | H01L 21/02175 361/301.4 |
| 2013/0082231 A1* | 4/2013 | Tada .................. | G11C 13/0007 257/4 |
| 2016/0225616 A1* | 8/2016 | Li ........................... | H10B 41/00 |
| 2016/0372359 A1 | 12/2016 | Kong et al. | |
| 2020/0126996 A1* | 4/2020 | Panda ............... | H01L 21/32139 |
| 2020/0235104 A1 | 7/2020 | Panda et al. | |
| 2021/0050517 A1* | 2/2021 | Banno .................. | H10N 70/884 |
| 2021/0410234 A1* | 12/2021 | Liu .......................... | B41M 3/12 |
| 2022/0359224 A1* | 11/2022 | Jiang .................. | H01L 21/0335 |

OTHER PUBLICATIONS

PCT International Search Report and Written Opinion in PCT/US2022/035078 dated Oct. 21, 2022, 8 pages.

Gas, P., et al., Formation of silicide thin films by solid state reaction, Applied Surface Science 73 (1993), pp. 153-161, 9 pages.

Matsui, Y., et al., An oxidation barrier layer for metal-insulator-metal capacitors: ruthenium silicide, Thin Solid Films 437 (2003), pp. 51-56, Elsevier, 6 pages.

Zhu, S., et al., Effects of the annealing temperature on Ni silicide/n-Si(1 0 0) Schottky contacts, Solid-State Electronics 48 (2004) pp. 29-35, Elsevier, 7 pages.

Ke, F., et al., A Ruthenium-Based Multimetal-Contact RF MEMS Switch With a Corrugated Diaphragm, Journal of Microelectromechanical Systems, vol. 17, No. 6, Dec. 2008, pp. 1447-1459, 13 pages.

Meng, X., et al., Atomic Layer Deposition of Silicon Nitride Thin Films: A Review of Recent Progress, Challenges, and Outlooks, Multidisciplinary Digital Publishing Institute (MDPI), Basel, Switzerland, Dec. 2016, (2) 1007, 28 pages.

Ezzat, S., et al., Resistivity and surface scattering of (0001) single crystal ruthenium thin films, Journal of Vacuum Science & Technology A 37, 031516 (May 15, 2019), 31 pages.

Fouda, A. N., et al., Effect of High-Temperature Annealing on Epitaxially Grown Ru Silicide Thin Films, Dec. 6, 2019, pp. 2387-2393, 7 pages.

* cited by examiner

METHODS OF FORMING MEMORY DEVICE WITH REDUCED RESISTIVITY

TECHNICAL FIELD

Embodiments of the present disclosure pertain to the field of memory devices and memory device manufacturing. More particularly, embodiments of the disclosure provide memory devices with reduced resistance including an interface layer with reduced roughness and methods of forming the same.

BACKGROUND

There is increasing interest in replacing tungsten (W) with ruthenium (Ru) as a metal layer in both dynamic random access memory (DRAM) and logic devices due to high resistivity in tungsten (W) layers. However, the resistivity (i.e., sheet resistance) and surface roughness of ruthenium (Ru) layers may increase during the deposition of a silicon nitride (SiN) layer and subsequent high temperature steps.

Current approaches utilize two steps to deposit a silicon nitride (SiN) layer on a ruthenium (Ru) layer including: (1) depositing the SiN layer by atomic layer deposition (ALD); and (2) depositing the SiN layer by plasma-enhanced chemical vapor deposition (PECVD) or by furnace deposition. These current approaches include depositing the SiN layer in two different substrate processing chambers, which decrease throughput and introduce additional interfaces and which expedite the oxidization of ruthenium (Ru) layers during high temperature annealing. Oxidation of the ruthenium layer is believed to increase resistivity of the ruthenium layer. Surface reaction of the metal layer and the silicon nitride layers can occur due to high deposition temperatures during formation of the silicon nitride layer. It is also desirable to form and protect high quality silicon nitride layers without comprising electrical properties, resistivity (i.e., sheet resistance) and surface roughness of other layers in a memory device.

Therefore, there is a need in the art for memory devices with reduced resistance, and methods of forming such memory devices.

SUMMARY

One or more embodiments of the disclosure are directed to methods forming a silicon nitride hard mask layer on a ruthenium layer comprising pre-treating the ruthenium layer with a plasma to form an interface layer on the ruthenium layer; and forming a silicon nitride layer on the interface layer using a plasma-enhanced chemical vapor deposition (PECVD) process.

Additional embodiments of the disclosure are directed to methods of forming a memory device including a silicon nitride hard mask layer on a ruthenium layer comprising pre-treating the ruthenium layer in the presence of a plasma to form an interface layer on the ruthenium layer and forming the silicon nitride layer on the interface layer by a plasma-enhanced chemical vapor deposition (PECVD) process. Pre-treating the ruthenium layer results in the interface layer having a reduced roughness and the memory device having a reduced resistivity compared to a memory device that does not include the interface layer.

Further embodiments of the disclosure are directed to memory devices comprising a first layer on a substrate; a ruthenium layer on the first layer; an interface layer on the ruthenium layer; and a silicon nitride layer on the interface layer.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
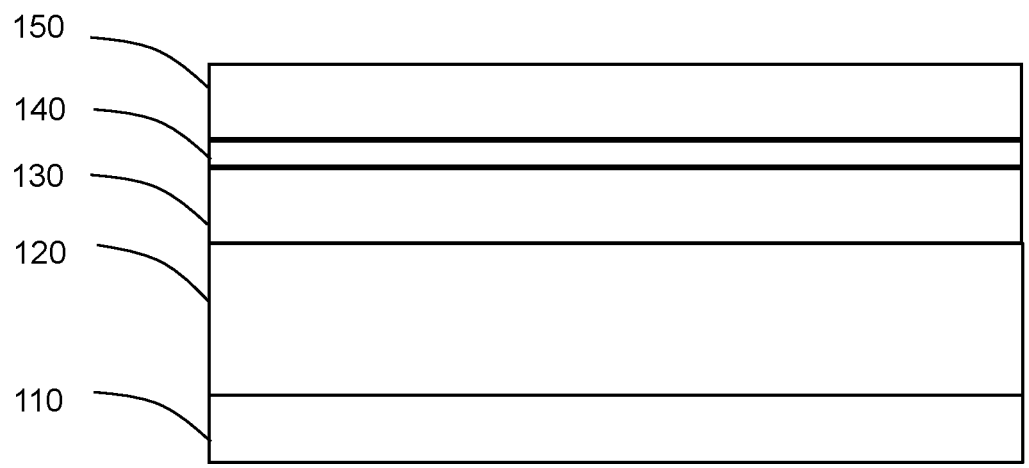
FIG. 1 illustrates a schematic representation of a memory device, according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

The term "on" indicates that there is direct contact between elements. The term "directly on" indicates that there is direct contact between elements with no intervening elements.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. As used herein, the terms "resistivity" and "sheet resistance" may be used interchangeably.

In one or more embodiments, interface layers and methods for forming interface layers with reduced roughness as compared to a film without an interface layer are provided. Embodiments provide memory devices and methods for forming memory devices with reduced resistivity as compared to a memory device without an interface layer are also provided. In some embodiments, an interface layer between the ruthenium layer and the silicon nitride layer reduces resistivity of the ruthenium layer and the memory device as a whole. It has been discovered that formation of ruthenium silicide (RuSi) results in increased resistivity of devices. More specifically, by using a conventional PECVD process that does not utilize pre-treatment of a ruthenium layer prior to depositing a silicon nitride layer contributes to RuSi formation, increased surface roughness of the ruthenium layer, and increased resistivity of the device. Transmission electron microscope (TEM) and energy-dispersive x-ray spectroscopy (EDX) were used to detect the presence or absence of RuSi. According to one or more embodiments, devices and methods for the manufacture of devices are substantially free of RuSi and a resistivity that is less than devices that do not include an interface layer.

Figure 2:
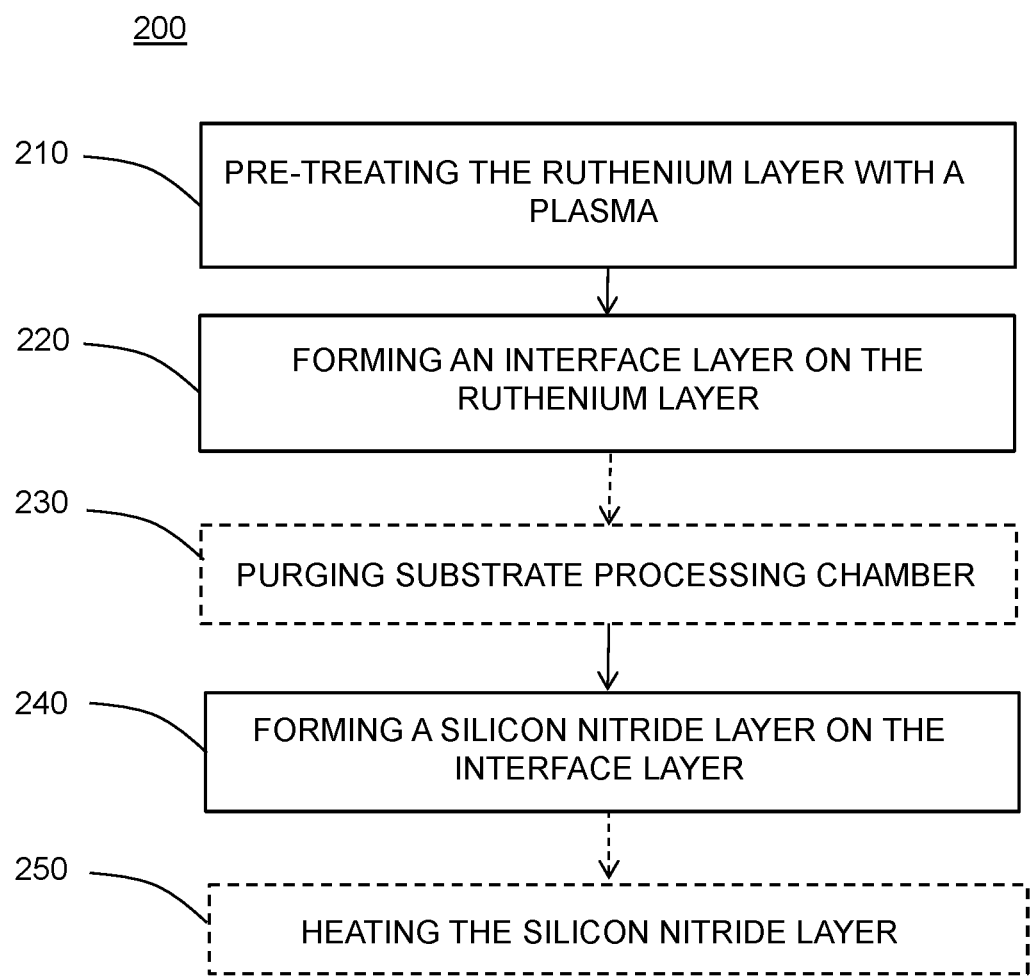
FIG. 2 illustrates a flowchart method for forming a silicon nitride hard mask layer on a ruthenium layer, according to one or more embodiments.

In one or more exemplary embodiments, a memory device formed in accordance with embodiments of the present disclosure may be a DRAM type integrated circuit. FIG. 1 illustrates a portion of a memory device 100 in accordance with one or more embodiment of the disclosure. In one or more embodiments, the memory device 100 comprises a first layer 120 on a substrate 110. There is a ruthenium layer 130 on the first layer 120, an interface layer 140 on the ruthenium layer 130, and a silicon nitride layer 150 on the interface layer 140. FIG. 2 is a flowchart illustrating a method 200 for forming a silicon nitride hard mask layer on a ruthenium layer according to one or more embodiment, in particular, an exemplary embodiment of a method 200 for forming the memory device 100 illustrated in FIG. 1.

Referring to FIG. 2, an exemplary embodiment of the method 200 comprises at operation 210 pre-treating the ruthenium layer with a plasma to form an interface layer on the ruthenium layer at operation 220. At operation 240, the method comprises forming a silicon nitride layer on the interface layer. In one or more embodiments, pre-treating the ruthenium layer and forming the silicon nitride layer are performed in a single processing chamber configured to process substrates without relocating the substrate to a second chamber.

The memory device 100 includes a substrate 110 having a first layer 120 thereon. The substrate 110 comprises one or more of the materials described above. The first layer 120 can be any suitable conductive material. In some embodiments, the first layer 120 comprises one or more of titanium (Ti), tantalum (Ta), titanium silicide (TiSi) or tantalum silicide (TaSi). In one or more embodiments, the first layer 120 comprises (or consists essentially of) titanium nitride. As used in this manner, the term "consists essentially of" means that the first layer comprises greater than or equal to about 95%, 98%, 99% or 99.9% of the stated element or composition, on an atomic basis. For example, the first layer 120 consisting essentially of titanium nitride means that the sum of the titanium and nitrogen atoms in the film make up greater than or equal to about 95%, 98%, 99% or 99.59% of the first layer 120 on an atomic basis as deposited.

The thickness of the first layer 120 can be varied. In one or more embodiments, the first layer 120 has a thickness in a range of from about 3 nm to about 5 nm. In one or more embodiments, the first layer 120 has a thickness in a range of from about 3.1 nm to about 4.9 nm, in a range from about 3.2 nm to about 4.8 nm, in a range of from about 3.3 nm to about 4.8 nm, in a range of from about 3.4 nm to about 4.7 nm, in a range of from about 3.5 nm to about 4.6 nm, in a range of from about 3.6 nm to about 4.5 nm, in a range of from about 3.7 nm to about 4.4 nm, in a range of from about 3.8 nm to about 4.3 nm, in a range of from about 3.9 nm to about 4.2 nm, or in a range of from about 4.0 nm to about 4.1 nm. In one or more embodiments, the substrate 110 has a thickness in a range of about 100 μm to about 900 μm.

In some embodiments, the memory device 100 includes a ruthenium layer 130 on the first layer 120. A thickness of the ruthenium layer 130 can be varied. In one or more embodiments, the ruthenium layer 130 has a thickness in a range of from about 10 nm to about 15 nm. In one or more embodiments, the ruthenium layer 130 has a thickness in a range of about 11 nm to about 14 nm, or in a range of about 12 nm to about 13 nm.

Referring to FIGS. 1 and 2, the method 200 comprises, at operation 210, pre-treating the ruthenium layer 130 with a plasma. In some embodiments, pre-treating the ruthenium layer 130 with a plasma comprises flowing a gas selected from the group consisting of $NH_3$, $N_2O$, $N_2$, Ar, and combinations thereof. In one or more embodiments, the method 200 further comprises controlling flow of the gas. In one or more embodiments, at operation 210, pre-treating the ruthenium layer 130 with the plasma comprises turning on gas flow to a desired flow rate and stabilizing the desired flow rate prior to performing operation 220. In one or more embodiments, pre-treating the ruthenium layer 130 with a plasma comprises flowing from about 50 sccm to about 500 sccm of $NH_3$. In one or more embodiments, pre-treating the ruthenium layer 130 with a plasma comprises flowing from about 1000 sccm to about 5000 sccm of $N_2O$. In one or more embodiments, pre-treating the ruthenium layer 130 with a plasma comprises flowing from about 1000 sccm to about 9000 sccm of $N_2$. In one or more embodiments, pre-treating the ruthenium layer 130 with a plasma comprises flowing from about 1000 sccm to about 5000 sccm of Ar. In one or more embodiments, pre-treating the ruthenium layer 130 with a plasma is performed at a pressure in a range from about 3 Torr to about 5 Torr.

In one or more embodiments, during pre-treating the ruthenium layer 130 a plasma power is in a range from about 200 watts to about 600 watts. In one or more embodiments, the plasma power is in a range from about 250 watts to about 550 watts, in a range from about 300 watts to about 500 watts, in a range from about 350 watts to about 450 watts, or in a range from about 375 watts to about 420 watts.

In one or more embodiments, during pre-treating, the ruthenium layer 130 is at a temperature in a range from about 300° C. to about 600° C. In one or more embodiments, the temperature is in a range from about 350° C. to about 550° C., in a range from about 400° C. to about 500° C., or in a range from about 425° C. to about 475° C.

In one or more embodiments, the method comprises at operation 210 pre-treating the ruthenium layer 130 to prevent formation of silicides. In one or more embodiments, pre-treating the ruthenium layer 130 prevents formation of ruthenium silicide (RuSi). In one or more embodiments, preventing formation of ruthenium silicide (RuSi) resulted in reduced resistivity as compared to a memory device having ruthenium silicide (RuSi) in the layers.

In one or more embodiments, the method 200 comprises at operation 220 forming an interface layer 140 on the ruthenium layer 130. The interface layer 140 is formed by pre-treating the ruthenium layer with the plasma. In one or more embodiments, the interface layer 140 comprises ruthenium, a nitride of ruthenium, an oxide of ruthenium, a carbide of ruthenium, or a combination thereof.

In one or more embodiments, the interface layer 140 is substantially free of oxygen. As used in this manner, the term "substantially free of oxygen" means that less than or equal to 5%, 4%, 3%, 2%, 1% or 0.5% of oxygen, on an atomic basis, in the interface layer. In one or more embodiments, at operation 210, during pre-treating the ruthenium layer 130 with the plasma, flowing the gas selected from the group consisting of $NH_3$, $N_2O$, $N_2$, Ar, and combinations thereof forms the interface layer 140 that is substantially free of oxygen.

In one or more embodiments, the interface layer comprises oxygen. In one or more embodiments, during pre-treating the ruthenium layer with the plasma, flowing an oxygen-containing gas forms the interface layer that comprises oxygen. In one or more embodiments, pre-treating the ruthenium layer 130 with a plasma comprises flowing from about 1000 sccm to about 5000 sccm of $N_2O$. In one or more embodiments, an interface layer that comprises oxygen has a resistivity that is greater than a resistivity of an interface layer that is substantially free of oxygen.

The thickness of the interface layer 140 can be varied. In some embodiments, the interface layer 140 has a thickness less than about 10 nm or less than about 5 nm. In some embodiments, the interface layer 140 has a thickness less than about 2 nm. In some embodiments, the interface layer 140 has a thickness in a range of from about 0.1 nm to about 1 nm. In one or more embodiments, the interface layer 140 has a thickness less than about 0.1 nm.

In one or more embodiments, the method 200 optionally includes at operation 230, purging the processing chamber in-between pre-treating the ruthenium layer and forming the silicon nitride layer. Purging the processing chamber removes unreacted precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the precursor by any suitable technique including, but not limited to, moving the substrate through a gas curtain to a portion or sector of the processing chamber that contains none or substantially none of the precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar). Purging the processing chamber, portion of the processing chamber, area adjacent the substrate surface, etc., removes unreacted reactant, reaction products and by-products from the area adjacent the substrate surface. In one or more embodiments, throughput can be increased by eliminating the purge step.

In one or more embodiments, pre-treating the ruthenium layer and forming the silicon nitride layer are performed in a single processing chamber configured to process substrates without transferring the substrate to a different or separate processing chamber. In one or more embodiments, the memory device 100 remains in the substrate processing chamber during purging at operation 230.

At operation 240, a silicon nitride layer 150 is formed on the interface layer 140. A thickness of the silicon nitride layer 150 can be varied. In one or more embodiments, the silicon nitride layer 150 has a thickness of less than about 5 nm. In one or more embodiments, the silicon nitride layer 150 has a thickness in a range of from about 1 nm to about 5 nm.

In one or more embodiments, the silicon nitride layer 150 is formed by plasma-enhanced chemical vapor deposition (PECVD). PECVD is used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. A PECVD process can be carried out using any suitable thin film deposition system. Any apparatus description described herein is illustrative and should not be construed or interpreted as limiting the scope of the embodiments described herein.

In one or more embodiments, the method 200 at operation 240 comprises flowing a silicon-containing precursor. In one or more embodiments, flowing the silicon-containing precursor comprises flowing one or more of silane, ($SiH_4$), disilane ($Si_2H_6$), trisilane ($Si_3H_8$), tetrasilane ($Si_4H_{10}$), iso-tetrasilane, neopentasilane ($Si_5H_{12}$), cyclopentasilane ($Si_5H_{10}$), hexasilane ($C_6H_{14}$), cyclohexasilane ($Si_6H_{12}$), a silicon-containing precursor having a general formula of $Si_xH_y$, where x is 2 or more, and combinations thereof.

In one or more embodiments, the method 200 further comprises, at operation 250, heating the silicon nitride layer 150. The deposition temperature of the silicon nitride layer 150 can be controlled to, for example, preserve the thermal budget of the device being formed. In one or more embodiments, heating the silicon nitride layer comprises heating the silicon nitride layer to a temperature in a range from about 775° C. to about 1075° C. In one or more embodiments, the silicon nitride layer is heated to a temperature in a range from about 750° C. to about 1100° C., in a range from about 800° C. to about 1050° C., in a range from about 825° C. to about 1025° C., in a range from about 850° C. to about 1000° C., in a range from about 875° C. to about 975° C., or in a range from about 900° C. to about 950° C.

In some embodiments, the elements of the silicon nitride layer 150 are substantially prevented from migrating into the ruthenium layer 130. For example, if the silicon nitride layer 150 comprises silicon and nitrogen atoms, silicon or nitrogen atoms are substantially prevented from migrating into the ruthenium layer 130. As used in this manner, the term "substantially prevented" means that less than or equal to about 10% or 5% of the silicon nitride layer 150 elements migrate into the ruthenium layer 130 through the interface layer 140.

Additional embodiments of the disclosure are directed to methods of forming a memory device including a silicon nitride hard mask layer on a ruthenium layer comprising pre-treating the ruthenium layer in the presence of a plasma to form an interface layer on the ruthenium layer. The silicon nitride layer is formed on the interface layer by a plasma-enhanced chemical vapor deposition (PECVD) process.

In one or more embodiments, pre-treating the ruthenium layer results in the interface layer having a reduced roughness and the memory device having a reduced resistivity compared to a memory device that does not include the interface layer.

In one or more embodiments, resistivity (i.e., sheet resistance) and surface roughness are measured after pre-treating the ruthenium layer in the presence of a plasma to form an interface layer on the ruthenium layer. In one or more embodiments, the resistivity (i.e., sheet resistance) and surface roughness are measured again after heating the silicon nitride layer.

In one or more embodiments, the surface roughness of each of the first layer 120, the ruthenium layer 130, the interface layer 140, and the silicon nitride layer 150 are measured. In one or more embodiments, the surface roughness at an interface between each of the first layer 120, the ruthenium layer 130, the interface layer 140, and the silicon nitride layer 150 are measured.

In one or more embodiments, the resistivity (i.e., sheet resistance) of the ruthenium layer 130 is measured. In one or more embodiments, the resistivity (i.e., sheet resistance) of the memory device 100 is measured. In one or more embodiments, the resistivity (i.e., sheet resistance) of the memory device varies. In one or more embodiments, sheet resistance is measured by using a 4-point probe. In one or more embodiments, the 4-point probe includes four electrical probes in a line with equal spacing between each of the four probes.

In one or more embodiments, the memory device 100 has a sheet resistance in a range of about 9 ohms per square ($\Omega$-cm) to about 11 ohms per square ($\Omega$-cm) after pre-treating the ruthenium layer and forming the silicon nitride layer. In one or more embodiments, the resistivity (i.e., sheet resistance) of a memory device after pre-treating a ruthenium layer to form an interface layer and forming a silicon nitride layer is lower than a resistivity (i.e., sheet resistance) of a memory device not having an interface layer.

In one or more embodiments, surface roughness is measured by using an atomic force microscope (AFM). In one or more embodiments, surface roughness varies in a ruthenium layer. In one or more embodiments, pre-treating the ruthenium layer 130 to form an interface layer 140, then forming a silicon nitride layer 150 has a lower surface roughness as compared to a film having a silicon nitride layer directly on a ruthenium layer having no interface layer in between. In one or more embodiments, the interface layer 140 has a roughness in a range of from about 0.6 nm to about 0.9 nm after pre-treating the ruthenium layer 130 and forming the silicon nitride layer 150. It was determined that when a silicon nitride layer is formed directly on the ruthenium layer having no interface layer in between, the ruthenium layer has a roughness that is about 0.3 nm to 0.5 nm higher than when an interface layer is present. For example, when no interface layer is present the roughness of the ruthenium layer is in a range from about 1.0 nm to about 1.5 nm. In one or more embodiments, at operation 250, heating the silicon nitride layer 150, does not vary a roughness of the interface layer 140. In one or more embodiments, after heating the silicon nitride layer 150 (operation 250), the interface layer 140 has a roughness in a range of from about 0.6 nm to about 0.9 nm.

In one or more embodiments, spectroscopy and microscopy techniques are used to analyze the composition of the interface layer 140 between the silicon nitride layer 150 and the ruthenium layer 130. In one or more embodiments, a transmission electron microscope (TEM) is used to analyze the composition of the interface layer 140.

In one or more embodiments, energy-dispersive x-ray spectroscopy (EDX) is used to analyze the composition of the interface layer 140. In one or more embodiments, an EDX system is attached to a TEM. EDX is based on the emission of specimen characteristic x-rays.

In one or more embodiments, spectroscopy and microscopy techniques are used to analyze diffusion of ruthenium atoms in the ruthenium layer 130. In one or more embodiments, a secondary ion mass spectrometer (SIMS) is used to measure diffusion of ruthenium atoms in the ruthenium layer 130. In one or more embodiments, a SIMS analysis of a memory device having an interface layer 140 between the ruthenium layer 130 and the silicon nitride layer 150 shows no diffusion of ruthenium atoms in the silicon nitride layer 150. In one or more embodiments, a SIMS analysis of a memory device not having an interface layer between a ruthenium layer and a silicon nitride layer shows diffusion of ruthenium atoms in the silicon nitride layer. It is believed that diffusion of ruthenium atoms into the silicon nitride layer negatively impacts device performance.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a silicon nitride hard mask layer on a ruthenium metal layer, the method comprising:
    forming a first layer selected from the group consisting of titanium (Ti), tantalum (Ta), titanium silicide (TiSi) or tantalum silicide (TaSi) on a substrate;
    forming the ruthenium metal layer on the first layer;
    pre-treating the ruthenium metal layer with a plasma while flowing a gas selected from the group consisting of $NH_3$, $N_2O$, $N_2$, Ar, and combinations thereof to form an interface layer on the ruthenium metal layer, the interface layer comprising one or more of an oxide, a nitride, and a carbide of ruthenium; and
    forming the silicon nitride hard mask layer directly on the interface layer using a plasma-enhanced chemical vapor deposition (PECVD) process.

2. The method of claim 1, further comprising controlling flow of the gas.

3. The method of claim 1, wherein pre-treating the ruthenium metal layer and forming the silicon nitride hard mask layer are performed in a processing chamber configured to process substrates.

4. The method of claim 3, further comprising purging the processing chamber between pre-treating the ruthenium metal layer and forming the silicon nitride hard mask layer comprising one or more of applying a vacuum or flowing a purge gas over the ruthenium metal layer, the purge gas comprising one or more of nitrogen ($N_2$), helium (He), and argon (Ar).

5. The method of claim 1, wherein during pre-treating the ruthenium metal layer a plasma power is in a range from about 200 watts to about 600 watts.

6. The method of claim 5, wherein during pre-treating the ruthenium metal layer is at a temperature in a range from about 300° C. to about 600° C.

7. The method of claim 5, wherein during forming a silicon nitride hard mask layer on the interface layer using a plasma-enhanced chemical vapor deposition, a plasma power is in a range of from 500 watts to 1200 watts.

8. The method of claim 1, wherein the interface layer is substantially free of oxygen.

9. The method of claim 1, wherein the interface layer has a thickness less than about 1 nm.

10. The method of claim 1, wherein forming the silicon nitride hard mask layer comprises flowing a silicon-containing precursor.

11. The method of claim 10, wherein flowing the silicon-containing precursor comprises flowing one or more of silane, ($SiH_4$), disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($C_6H_{14}$), cyclohexasilane ($Si_6H_{12}$), a silicon-containing precursor having a general formula of $Si_xH_y$, where x is 2 or more, and combinations thereof.

12. The method of claim 1, further comprising heating the silicon nitride hard mask layer to a temperature in a range of from about 750° C. to about 1100° C.

13. The method of claim 1, wherein a memory device including the silicon nitride hard mask layer formed by the method has a sheet resistance in a range of about 9 ohms per square ($\Omega$-cm) to about 11 ohms per square ($\Omega$-cm) after pre-treating the ruthenium metal layer and forming the silicon nitride hard mask layer.

14. A method of forming a memory device including a silicon nitride hard mask layer on a ruthenium metal layer, the method comprising:
    forming a first layer selected from the group consisting of titanium (Ti), tantalum (Ta), titanium silicide (TiSi) or tantalum silicide (TaSi) on a substrate;
    forming the ruthenium metal layer on the first layer;
    pre-treating the ruthenium metal layer with a plasma to form an interface layer on the ruthenium metal layer; and
    using a plasma-enhanced chemical vapor deposition (PECVD) process to directly form the silicon nitride hard mask layer on the interface layer, wherein pre-treating the ruthenium metal layer results in the interface layer having a roughness in a range of from about 0.6 nm to about 0.9 nm.

15. The method of claim 14, wherein the memory device has a sheet resistance in a range of about 9 ohms per square ($\Omega$-cm) to about 11 ohms per square ($\Omega$-cm) after pre-treating the ruthenium metal layer and forming the silicon nitride hard mask layer.

* * * * *